United States Patent [19]

Olla

[11] Patent Number: 5,065,504
[45] Date of Patent: Nov. 19, 1991

[54] METHOD OF FORMING FLEXIBLE METAL LEADS ON INTEGRATED CIRCUITS

[75] Inventor: Michael A. Olla, Austin, Tex.

[73] Assignee: Microelectronics and Computer Technology Corporation, Austin, Tex.

[21] Appl. No.: 608,769

[22] Filed: Nov. 5, 1990

[51] Int. Cl.⁵ ................ H01R 43/00; B23P 25/00
[52] U.S. Cl. .......................... 29/827; 29/879;
  29/33 M; 72/337; 72/379.2; 140/105; 357/79
[58] Field of Search ............ 29/827, 33 M, 874, 838;
  357/79; 174/52.4; 72/337, 379; 140/105

[56] References Cited

U.S. PATENT DOCUMENTS

| | | |
|---|---|---|
| Re. 28,582 | 10/1975 | Dammar. |
| 4,068,917 | 12/1977 | Diaz .................................. 140/105 |
| 4,103,718 | 8/1978 | Steigerwald ....................... 140/105 |
| 4,361,173 | 11/1982 | Storimans ............................ 140/1 |
| 4,371,012 | 2/1983 | Weresch ............................ 140/105 |
| 4,390,598 | 6/1983 | Phy .................................... 428/577 |
| 4,399,610 | 8/1983 | Moyer ................................. 29/827 |
| 4,553,420 | 11/1985 | Fierkens et al. ............... 29/827 X |
| 4,559,978 | 12/1985 | Glatzel ............................... 140/147 |
| 4,602,661 | 7/1986 | Heller et al. ....................... 140/105 |
| 4,625,772 | 12/1986 | Maskens ............................. 140/105 |
| 4,633,920 | 1/1987 | Donovan et al. ................... 140/105 |
| 4,763,401 | 8/1988 | Marinoni et al. . |
| 4,787,426 | 11/1988 | Linker et al. ...................... 140/147 |
| 4,829,669 | 5/1989 | Nakajima ............................. 29/874 |

OTHER PUBLICATIONS

"Comparative Compliance of Generic Lead Designs for Surface Mounted Components", by Robert W. Kotlowitz, AT&T Bell Laboratories, Whippany, N.J., 07981, pp. 7-19.

Primary Examiner—Carl J. Arbes
Attorney, Agent, or Firm—David M. Sigmond

[57] ABSTRACT

Slide forming tape-automated-bonded leads extending from an integrated circuit chip with a support ring on the leads between the outer periphery of the chip and the outer lead ends. After the leads are formed the support ring remains attached to the vertical portion of the leads opposite the chip. The present invention is well suited for minimizing and footprint on relatively long TAB leads which fan out and require a support ring to maintain proper lead pitch.

20 Claims, 4 Drawing Sheets

METHOD OF FORMING FLEXIBLE METAL LEADS ON INTEGRATED CIRCUITS

BACKGROUND OF THE INVENTION

1. Field of the Invention

The present invention relates to slide forming flexible metal leads bonded to the top of an integrated circuit chip, and more particularly to slide forming tape-automated-bonding leads without damaging a support ring secured to the tops of the leads between the chip and the lead ends while minimizing footprint size.

2. Description of Related Art

In the manufacture of integrated circuits, silicon wafers containing many individual integrated circuits are fabricated and then the wafers are cut into individual integrated circuit chips or die. The chips are subsequently packaged and interconnected to other electrical components. During packaging, electrically conductive metal leads can be bonded between a chip and a high density copper/polyimide interconnect substrate to provide proper electrical interconnection between different chips.

One technique for providing conductive interconnecting metal leads is tape-automated-bonding (TAB). The leads can be fabricated on a continuous carrier film in which the tape is a laminate of copper and a plastic insulator and the leads are etched in the copper while on the plastic carrier using well known etching processes. The film can then be perforated along the edges with sprocket holes for use in advancement and alignment of the carrier film. Individual chips can be electrically bonded to individual lead frames in the tape and the lead frames can be removed or excised from the carrier film. Usually it is necessary to bend or form the leads prior to bonding the outer lead ends to a substrate.

Each generation of integrated circuits is becoming more complex and is requiring more leads on ever decreasing lead spacings (i.e., lead pitches). The pads on the integrated circuit chips, to which the leads are bonded, are configured and spaced often for the purpose of optimizing the performance of the chip and making the best use of the available space on the chip. The result is that the lead pitch on the portions of the leads in close proximity to the chip pads is seldom uniform, and is seldom as large as the lead pitch on the portions of the leads that lay furthers from the chip. That is, the leads "fan out" between the chip and the substrate, and in the absence of a support ring (such as polyimide film), conventional lead forming methods would be likely to displace the leads in pitch as a form punch moved across those areas on the leads which are not parallel to the direction of the form punch travel. A support ring may also be necessary to keep the leads in place for assembly and test operations prior to boding the outer lead ends to a substrate. The amount of lead pitch displacement will depend on the lead dimensions and materials. For example, copper TAB leads 0.006 inches wide may not yield significant pitch displacement for relatively short leads, e.g. less than 0.040 inches long. But for relatively long leads, e.g. greater than 0.080 inches long, the pitch displacement is likely to be significant and result in alignment problems with bonding pads on a substrate.

Furthermore, it is desirable to minimize the "footprint" size of the leads, which is defined as the distance that the outer ends of the leads extend beyond the periphery of the chip in the direction parallel to the top surface of the chip after the leads are bent or formed and thus shaped to be bonded to a substrate. The advantages which flow from minimizing the footprint size of the leads include increased electrical switching speed, increased reliability, and reduced substrate size, cost and weight Unfortunately, in the prior art the use of a support ring attached to the leads can increase the size of the footprint by at least the size of the support ring since, after applying conventional lead forming techniques, the support ring is positioned on a portion of the leads that extends away from the outer periphery of the chip and lays parallel to the top surface of the chip. One solution suggested in the prior art is to strip the support ring during the lead forming operation. This, however, may be unacceptable in certain applications.

SUMMARY OF THE INVENTION

The present invention provides a simple and convenient technique for slide forming flexible metal leads such as TAB leads bonded to an integrated circuit chip, wherein after the leads are formed, a support ring attached to the leads is positioned on a portion of the leads that is perpendicular to the top surface of the chip, thereby not increasing the size of the lead's footprint while leaving the support ring intact and undamaged.

An object of the present invention is to form TAB leads with a support ring on the vertical leg of the leads opposite the chip while minimizing the footprint size of the leads.

A feature of the present invention is a method of forming a plurality of flexible metal leads connected to an integrated circuit chip which extend beyond the outer periphery of the chip and terminate at outer lead ends, comprising, aligning a first portion of the leads between the top of a lead form anvil and the bottom of a clamp, wherein the first portion begins at a first end adjacent to the chip outer periphery and ends at a second end between the chip outer periphery and the outer lead ends; actuating the clamp toward the anvil to releasably secure the second end of the first portion of the leads between the clamp and the anvil; actuating a first punch toward the leads so that the first punch contacts the second ends of the first portion of the leads and bends the leads at a first corner toward the anvil; actuating a second punch toward the leads so that an abutment on the second punch contacts the leads at or near the first corners and releasably secures the leads against the anvil; actuating a third punch toward the leads after the second punch releasably secures the leads so that an abutment on the third punch contacts the leads between the first corners and the outer lead ends and forces the leads toward the anvil, the bottom of the leads slide against the anvil, and the top of the leads slide against the abutment on the third punch; continuing to actuate the third punch so that a second corner of the leads is releasably secured between the abutment on the third punch and a corner of the anvil, thereby forming a second portion of the leads with a first end at the first corner and a second end at the second corner, and a third portion of the leads with a first end at the second corner and a second end at the outer lead ends; and retracting the clamp, first punch, second punch and third punch so that the leads are released, thereby slide forming the leads.

An advantage of the present invention includes eliminating the relative movement between the leads and the lead form anvil while bending two perpendicular corners into the leads in an economical manner.

BRIEF DESCRIPTION OF THE DRAWINGS

A better understanding of the present invention can be obtained when the following detailed description of the preferred embodiment is read in conjunction with the following drawings, in which.

DETAILED DESCRIPTION OF THE PREFERRED EMBODIMENTS

Figure 1:
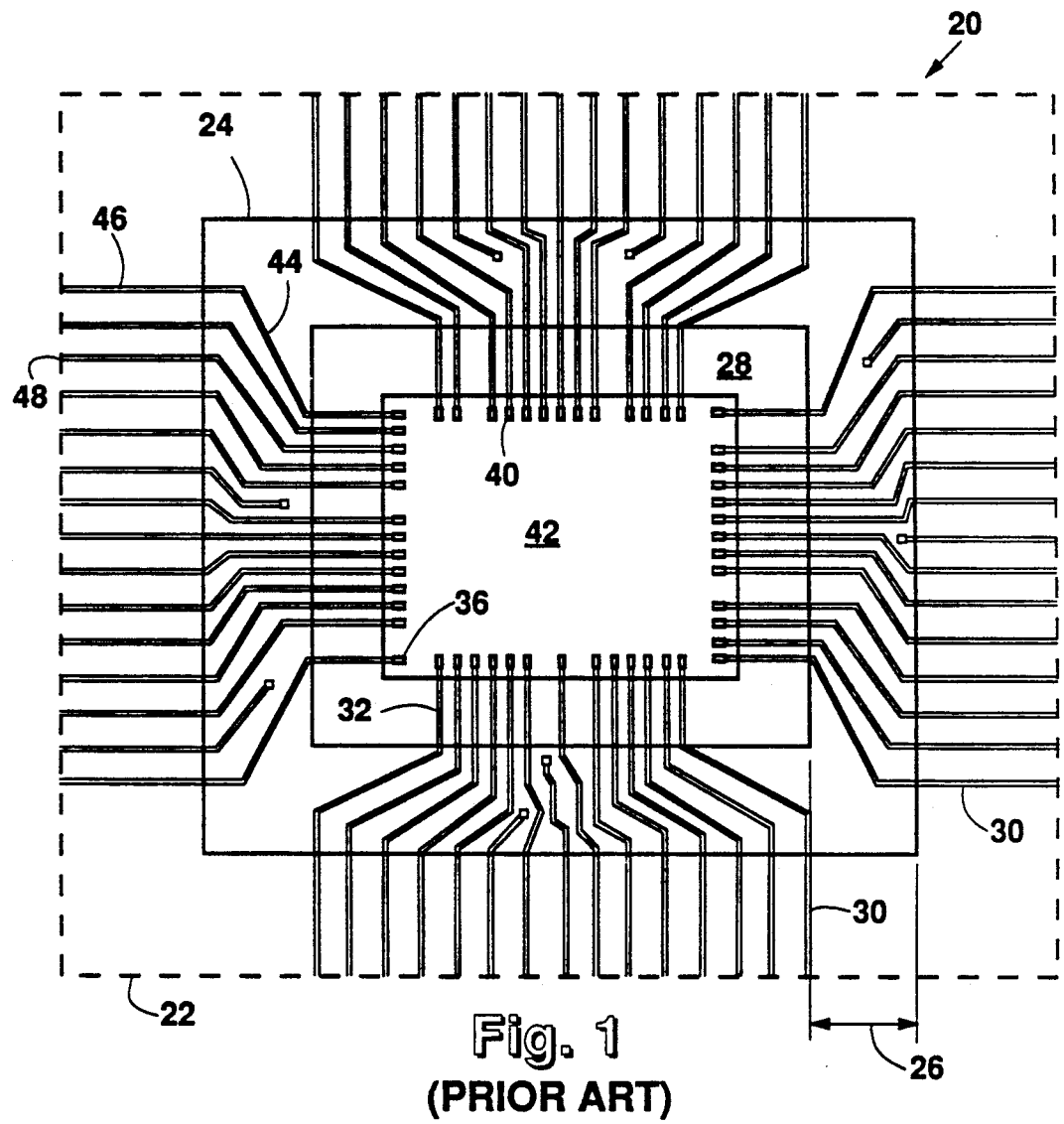
FIG. 1 is a top plan view of a conventional combination of TAB leads bonded to an integrated circuit chip.

Referring now to the drawings, and particularly to FIG. 1, a conventional pattern of flexible metal leads bonded to the top surface of an integrated circuit is generally referred to as a TAB 20. Frame 20 has been excised from a plastic carrier film (not shown) along excise window 22. Frame 20 includes carrier film support shown as polyimide support ring 24 having a width 26 of 0.020 inches. Support ring 24 contains a central window or opening 28. Leads 30 contain parallel inner lead portions 32 which overhang central opening 28 and can be mass bonded at inner lead ends 36 to bumps or pads 40 on integrated circuit chip 42, for instance by a method and apparatus for laser bonding inner TAB leads described in U.S. Pat. No. 4,845,335 by Andrews et al. Intermediate portions 44 of leads 30 are secured to support ring 24 and fan out in the support ring area. Outer portions 46 of leads 30 extend in parallel beyond the periphery of support ring 24 and terminate at outer lead ends 48. Outer lead ends 48 can subsequently be bonded to a substrate to which chip 42 can be mounted upon.

Figure 2:
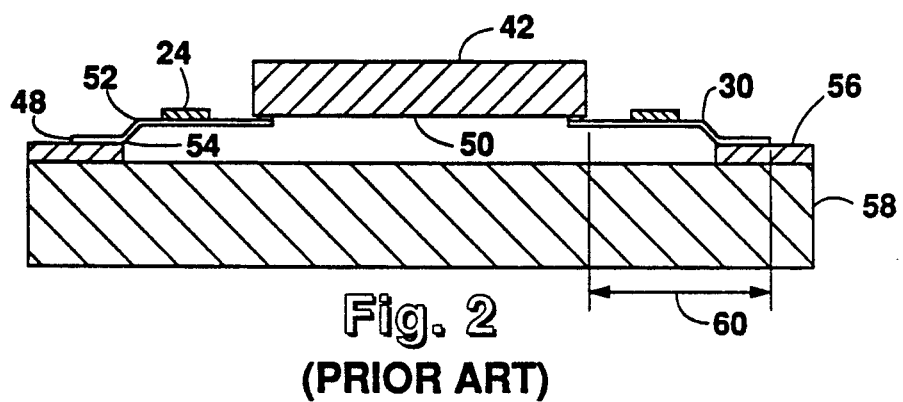
FIG. 2 is a cross-sectional elevational view of conventionally formed leads with the leads formed face-down.

There are several well known methods for bonding TAB leads 30 of chip 42 to a substrate. For instance, in FIG. 2 leads 30 are formed "face-down". That is, leads 30 are bent in corners 52 and 54 to elevate outer lead ends 48 above top surface 50 of chip 42, chip 42 is inverted, and outer lead ends 48 are bonded to bonding pads 56 on an electrical interconnect substrate 58. Face-down bonding has the advantage of allowing relatively short lead lengths as well as a wide variety of efficient heat extraction techniques that are not otherwise possible when the chip is mounted "face-up", as will be described. However, face-down bonding has several drawbacks. The isolation of top surface 50 may prevent chip 42 from being inspected or electrically probed. In addition, the required cleaning of debris after outer lead ends 48 are bonded, for instance by solder reflow, to pads 56 on substrate 58 may be very difficult. Furthermore, it is desirable to minimize the distance that outer lead ends 48 extend beyond the outer periphery of chip 42 so that chip packaging density can be maximized. This distance is shown as footprint 60. For face-down bonding footprint 60 is typically relatively large.

Figure 3:
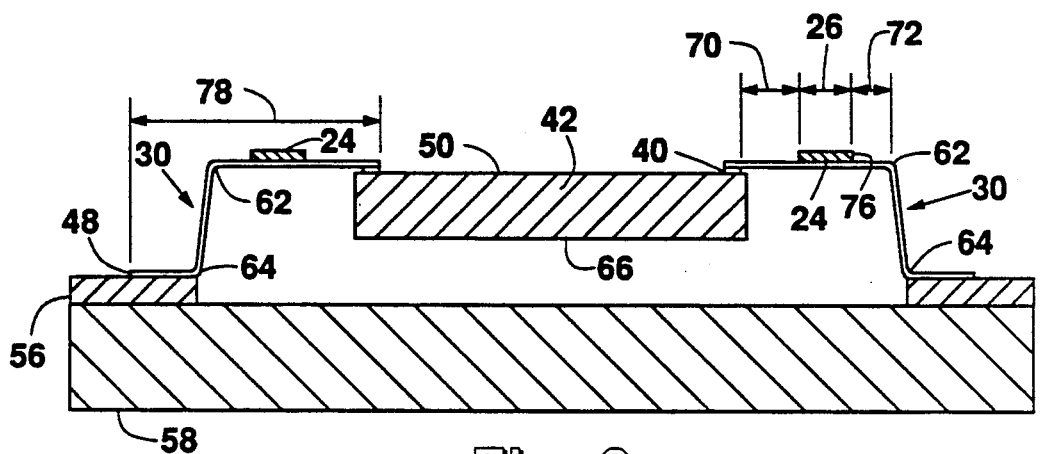
FIG. 3 is a cross-sectional elevational view of conventionally formed leads attached to a support ring with the leads formed face-up.

In FIG. 3 another well known method for bonding TAB leads 30 to a substrate 58 is shown in which leads 30 are formed "face-up". That is, leads 30 are bent in corners 62 and 64 to position outer lead ends 48 below top surface 50, and preferably bottom surface 66 of chip 42. Outer lead ends 48 can then be bonded to pads 56 on substrate 58. Face-up bonding is considered advantageous for manufacturing systems with low to moderate power dissipation. However, face-up bonding normally requires relatively long lead lengths on the order of 0.080 inches or more and, therefore, a support ring attached to the leads to maintain lead pitch. A first lead length 70, preferably at least 0.013 inches, is normally required between chip pad 40 and support ring 24 to provide a thermal barrier to prevent polyimide support ring 24 from warping as a result of heat generated from chip 42. In addition, width 26 of polyimide ring 24 is preferably at least 0.013 inches, and more preferably at least 0.20 inches. Additionally, a second lead length 72, preferably at least 0.015 inches, is normally required beyond the outer edge 76 of support ring 24 to provide adequate space for clamping leads 30 in order to form corners 62 and 64.

The present invention is directed to eliminating the increase in footprint size due to first lead length 70 and support ring width 26.

Figure 4:
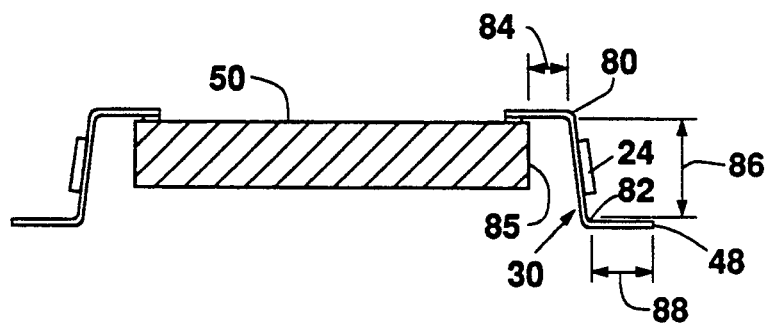
FIG. 4 is a cross-sectional elevational view of leads formed with a support ring on the vertical portion of the leads in accordance with the present invention.

As seen in FIG. 4, the present invention eliminates the increased footprint size due to first lead length 70 and support ring width 26 by an improved face-up forming technique. A first substantially perpendicular corner 80 and a second substantially perpendicular corner 82 are formed so that a first lead portion 84 is parallel to chip top surface 50 between outer edge 85 of chip 42 and first corner 80; a second lead portion 86 is substantially perpendicular to chip top surface 50 between first corner 80 and second corner 82 and is fixedly secured to support ring 24 on the side of leads 30 opposite chip 42; and a third lead portion 88 below chip top surface 50 and more preferably below chip bottom surface 66 is substantially perpendicular to chip top surface 50 between second corner 82 and outer lead end 48.

Figure 5:
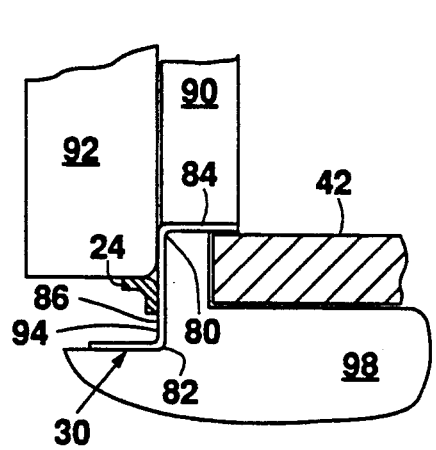
FIG. 5 is a cross-sectional elevation view of a conventional lead forming operation with a support ring located on a vertical portion of the leads opposite the chip, in which a punch strips the support ring.

In FIG. 5 there is shown a conventional method for forming outer leads. Clamp 90 releasably secures lead 30 against lead form anvil 98 and punch 92 is actuated downward in sliding engagement with clamp 90 to form corners 80 and 82 against anvil 98. Such a conventional lead forming technique is described in U.S. Pat. No. 4,103,718, the disclosure for which is hereby incorporated by reference. In this illustration support ring 24 is located on the second lead portion 86 on side 94 opposite chip 42. As punch 92 continues downward it contacts and strips support ring 24.

Figure 6:
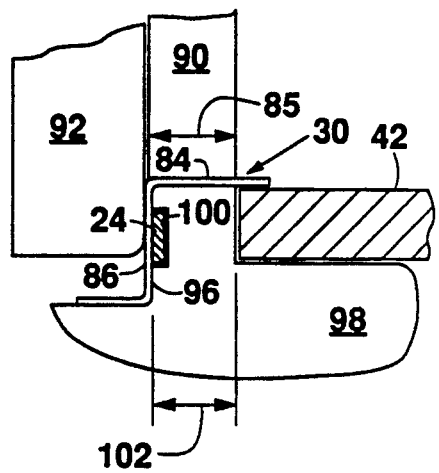
FIG. 6 is a cross-sectional elevational view of a conventional lead forming operation with a support ring located on a vertical portion of the leads nearest the chip.

In FIG. 6 is shown a conventional method for forming outer leads similar to FIG. 5 except support ring 24 is located on side 96 of second lead portion 86 nearest the chip. In this illustration, clearly punch 92 will not contact or strip support ring 24. However, in this arrangement a recess 100 in form anvil 98 would be necessary to accommodate support ring 24. As a result, width 102 of form anvil 98 would probably need to be increased to maintain the form anvil's structural integrity, thereby increasing the size of first lead portion 84 and the overall footprint size.

Referring now to FIGS. 7-13, the present invention for slide forming flexible metal leads on an integrated circuit is now described.

Figure 7:
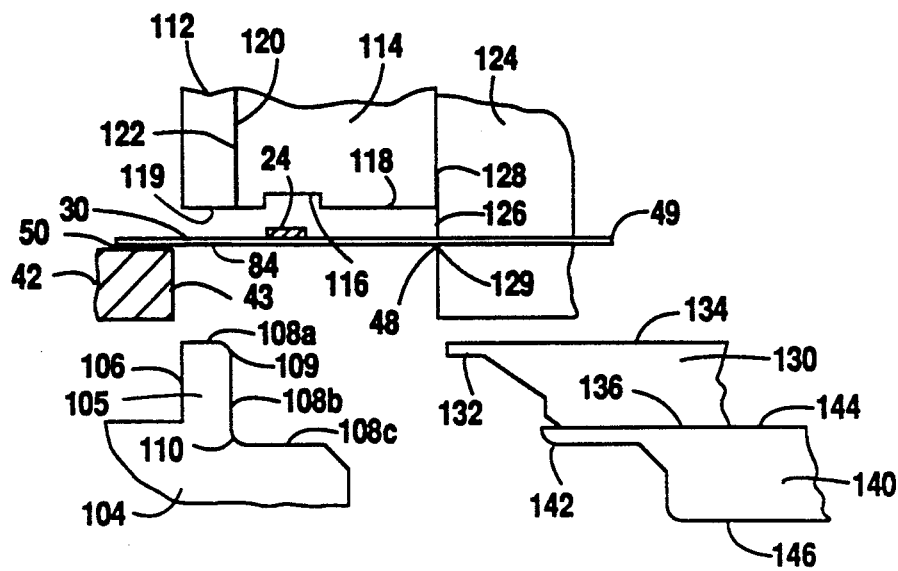
FIG. 7 is a cross-sectional elevational view of the present invention in which the leads are aligned between a clamp and a form anvil prior to excising a frame from a tape carrier.

In FIG. 7 chip 42 has a rectangular top surface 50 and four adjacent side surfaces perpendicular to surface 50. Copper TAB leads 30 extend beyond all four side surfaces in parallel to top surface 50. Polyimide support ring 24 is connected to the tops of leads 30 between the ends of the leads and chip 42. For illustration purposes, only leads 30 extending beyond chip side surface 43 are shown. However, the present invention is well suited to simultaneously form leads extending beyond all four side surfaces of a chip 42. Lead form anvil 104 contains lead form abutment 105 with vertical surface 106 facing chip 42, top horizontal surface 108a, vertical surface 108b opposite chip 42, and bottom horizontal surface 108c. First perpendicular lead form corner 109 connects surfaces 108a and 108b, and second perpendicular lead form corner 110 connects surfaces 108b and 108c. Clamp 112 is positioned above anvil abutment 105. A portion 84 of leads 30 between chip 42 and support ring 24 is aligned between clamp 112 and anvil abutment 105. First punch 114 is adjacent to clamp 112 and contains recess 116 in bottom surface 118 to avoid contacting support ring 24. Second side 120 of clamp 112 is adjacent to first side 122 of first punch 114. Sides 120 and 122 are releasably secured together as clamp 112 and first punch 114 are actuated downward vertically. However, when clamp 112 meets mechanical resistance sides 120 and 122 will slideably engage so first punch 114 can continue moving downward. Likewise, excise clamp 124 has first side 126 adjacent to second side 128 of first punch 114, and sides 126 and 128 are releasably secured until punch 114 and excise clamp 124 are actuated downward vertically and excise clamp 124 meets mechanical resistance, at which time surfaces 126 and 128 slideably engage, clamp 124 becomes stationary and punch 114 continues to move downward. Excise blade 129 is positioned beneath excise clamp 124 with leads 30 aligned therebetween. Second punch 130 is positioned so that abutment 132 is horizontally aligned with first anvil corner 109 and top surface 134 is horizontally aligned with the top of abutment 105. Third punch 140 is positioned so that abutment 142 is horizontally aligned with second anvil corner 110. Bottom surface 136 of second punch 130 is adjacent to top surface 144 of third punch 140. Sides 136 and 144 are releasably secured so that as punches 130 and 140 are actuated toward anvil side 108b, when second punch 130 meets mechanical resistance sides 136 and 144 slideably engage and third punch 140 continues toward anvil side 108b.

Initially leads 30 are releasably secured between clamp 124 and excise blade 129. Clamp 112 and first punch 114 are then actuated downward vertically toward leads 30.

Figure 8:
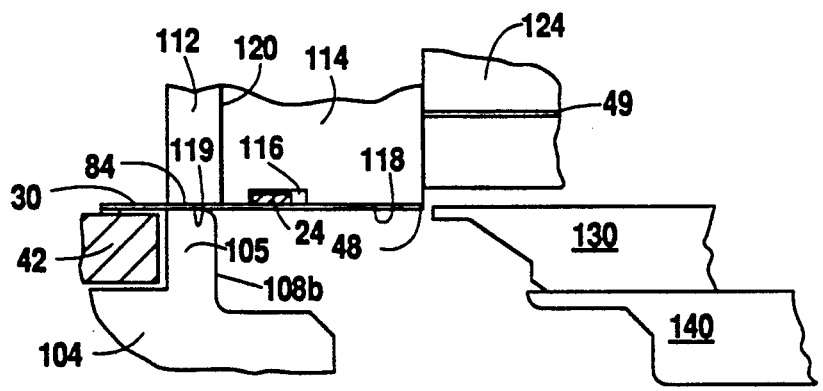
FIG. 8 is a cross-sectional elevational view of the present invention in which the frame has been excised and the leads are secured between a clamp and a form anvil.

In FIG. 8, the bottom 118 of first punch 114 contacts the tops of leads 30 and applies pressure to the leads. Outer lead ends 48 are forced against excise blade 129 and slice apart, thereby excising outer lead ends 48 from carrier film 49. Support ring 24 is housed in first punch recess 116 without contacting first punch 114. First punch 114 continues downward movement until first portion 84 of leads 30 between support ring 24 and chip 42 is releasably secured between bottom surface 119 of clamp 112 and anvil abutment 105. Side 120 of clamp 112 and side 108b of anvil 104 form parallel surfaces, spaced by the height of leads 30, perpendicular to the end of lead portion 84.

Figure 9:
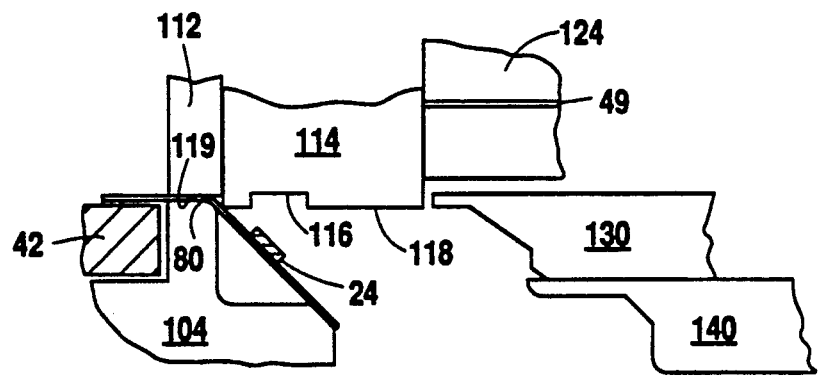
FIG. 9 is a cross-sectional elevational view of the present invention in which a first punch partially forms a first corner in the leads.

In FIG. 9, punch 114 slideably engages clamp 112 and bends leads 30 at a first corner 80 against corner 109 of anvil abutment 105, thereby bending leads 30 toward anvil surfaces 108b and 108c and partially forming leads 30.

Figure 10:
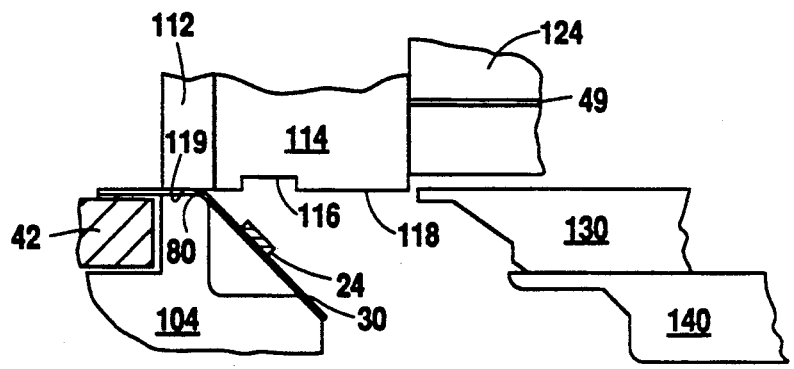
FIG. 10 is a cross-sectional view of the present invention in which a first punch retracts after partially forming a first corner in the leads.

In FIG. 10 punch 114 is retracted so that punch bottom surface 118 is coplanar with bottom surface 119 of clamp 112.

Figure 11:
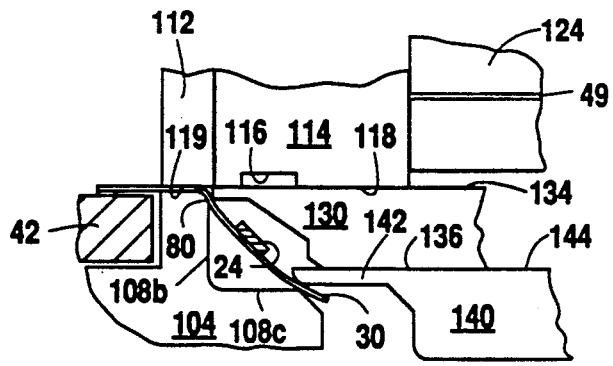
FIG. 11 is a cross-sectional view of the present invention in which a second punch clamps the first corner of the leads against the form anvil and a third punch slideably engages the leads and forces the leads toward the form anvil.

In FIG. 11, punches 130 and 140 are actuated horizontally toward leads 30. Top surface 134 of second punch 130 slideably engages bottom surface 118 of punch 114 which acts as a guide. Second punch abutment 132 then contacts leads 30 at or near corners 80 without contacting support ring 24 and secures leads 30 against anvil surface 108b. At this point the movement of second punch 130 is halted and top surface 144 of third punch 140 slideably engages bottom surface 136 of second punch 130. Third punch abutment 142 contacts leads 30 below support ring 24 and sandwiches leads 30 between abutment 142 and anvil lower surface 108c.

Figure 12:
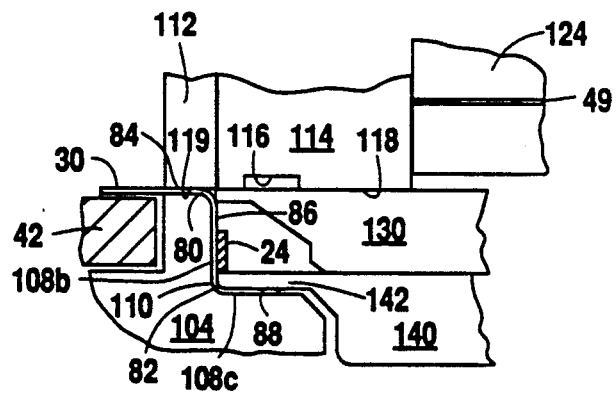
FIG. 12 is a cross-sectional view of the present invention in which a third punch forces a second corner of the leads against the form anvil thereby slide forming the leads.

In FIG. 12 third punch 140 continues moving horizontally and forces leads 30 toward anvil surface 108b. As this occurs the bottom of leads 30 slide against anvil surface 108c and the top of leads 30 slide against third punch abutment 142. Third punch 140 then forces a second corner 82 of leads 30 into and against corner 110 of anvil 104. As a result corners 80 and 82 of leads 30 form at right angles, lead portions 84 and 88 are parallel to chip top surface 50, and lead portion 86 between lead corners 80 and 82 and attached to support ring 24 is perpendicular to chip top surface 50.

Figure 13:
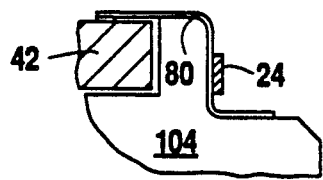
FIG. 13 is a cross-sectional view of the present invention in which the clamp and the punches are retracted.

In FIG. 13 clamp 112 and punches 114, 130 and 140 are retracted. Leads 30 are now formed with support ring 24 on vertical leg 86 uncontacted and undamaged.

If desired, anvil corners 109 and 110 can be in excess of 90 degrees in order to compensate for "spring-back" in the leads and assure that lead corners 80 and 82 are perpendicular after the leads are formed. The amount of spring-back in leads 30 will depend on factors which include the thickness and temper of the leads.

The mechanical details for constructing an apparatus to perform the present invention of sliding lead forming are considered to be known by those having skill in the art without the need for undue experimentation, and therefore will not be described herein. For instance, second punch 130 and third punch 140 could be driven by a cam or driven independently by different mechanisms.

The present invention, therefore, is well adapted to carry out the objects and attain the ends and advantages mentioned, as well as others inherent therein. While presently preferred embodiments of the invention have been described for the purpose of disclosure, numerous changes in the steps of the process and the parts of the apparatus will be readily apparent to those skilled in the art, and are encompassed within the spirit of the present invention and the scope of the appended claims.

What is claimed is:

1. A method of forming a plurality of flexible metal leads connected to an integrated circuit chip which extend beyond the outer periphery of the chip and terminate at outer lead ends, comprising:
    aligning a first portion of the leads between the top of a lead form anvil and the bottom of a clamp, wherein the first portion begins at a first end adjacent to the chip outer periphery and ends at a second end between the chip outer periphery and the outer lead ends,
    actuating the clamp toward the anvil to releasably secure the second end of the first portion of the leads between the clamp and the anvil,
    actuating a first punch toward the leads so that the first punch contacts the second ends of the first portion of the leads and bends the leads at a first lead corner toward the anvil,
    actuating a second punch toward the leads so that an abutment on the second punch contacts the leads at or near the first lead corners and releasably secures the leads against the anvil,
    actuating a third punch toward the leads after the second punch releasably secures the leads so that an abutment on the third punch contacts the leads between the first lead corners and the outer lead ends and forces the leads toward the anvil, the bottom of the leads slide against the anvil, and the top of the leads slide against the abutment on the third punch,
    continuing to actuate the third punch so that a second corner of the leads is releasably secured between the abutment on the third punch and a corner of the anvil, thereby forming a second portion of the leads with a first end at the first lead corner and a second end at the second lead corner, and a third portion of the leads with a first end at the second lead corner and a second end at the outer lead ends, and
    retracting the clamp, first punch, second punch and third punch so that the leads are released, thereby slide forming the leads.

2. The method of claim 1, further comprising, retracting the first punch until the bottom of the first punch is essentially co-planar with the bottom of the clamp before the second or third punches contact the leads.

3. The method of claim 1 wherein the clamp and first punch move vertically with respect to the chip, and the second and third punches move horizontally with respect to the chip.

4. The method of claim 1 wherein the first punch slidingly engages the clamp.

5. The method of claim 1 wherein the top of the second punch slidingly engages the bottom of the first punch.

6. The method of claim 1 wherein the top of the third punch slidingly engages the bottom of the second punch, and the bottom of the third punch slidingly engages the leads.

7. The method of claim 1, further comprising,
    a support ring attached to the leads between the first and second corners of the leads on the side opposite the chip after the leads are formed.

8. The method of claim 7, wherein the portion of the leads between the first and second lead corners is vertical with respect to the chip.

9. The method of claim 1, further comprising,
    excising the leads at the outer lead ends from a TAB carrier film prior to releasably securing the leads.

10. A method of forming a plurality of flexible metal leads bonded to the top of an integrated circuit chip, wherein the leads extend beyond the outer periphery of the top of the chip, are essentially parallel to the top surface of the chip, and terminate at outer lead ends, comprising: aligning a first portion of the leads between the top of a lead form anvil and the bottom of a clamp, wherein the first portion begins at a first end adjacent to the chip outer periphery and ends at a second end between the chip outer periphery and the outer lead ends,
    actuating the clamp toward the anvil to releasably secure the second end of the first portion of the leads between the clamp and the anvil, wherein a first side of the clamp and a first side of the anvil form parallel surfaces essentially perpendicular to the second end of the first portion of the leads,
    actuating a first punch toward the leads in sliding engagement with the first side of the clamp so that the first punch contacts the second ends of the first portion of the leads and bends the leads at a first lead corner toward the first side of the anvil, thereby partially forming the leads,
    retracting the first punch until the bottom of the first punch is above the leads,
    actuating a second punch toward the leads in sliding engagement with the bottom of the first punch so that an abutment on the second punch contacts the leads at the first lead corners and releasably secures the first lead corners against the first side of the anvil,
    actuating a third punch toward the leads in sliding engagement with the bottom of the second punch, after the second punch releasably secures the first lead corners, so that an abutment on the third punch contacts the leads between the first lead corners and the outer lead ends, and forces the leads toward the first side of the anvil, the bottom of the leads slide against a second anvil surface substantially perpendicular to the first anvil surface, and the top of the leads slide against the abutment on the third punch,
    continuing to actuate the third punch so that a second corner of the leads is releasably secured between the abutment on the third punch and the intersection of the first and second anvil surfaces, thereby forming a second portion of the leads with a first end at the first lead corner and a second end at the second lead corner, and a third portion of the leads with a first end at the second lead corner and a second end at the outer lead ends, and retracting the clamp, second punch and third punch so that the leads are released, wherein the first and second lead corners are essentially perpendicular, the first and third portions of the leads are essentially parallel to the top surface of the chip, and the second portion of the leads is essentially perpendicular to the top surface of the chip.

11. The method of claim 10 wherein the chip contains a rectangular top surface, four side surfaces essentially perpendicular to the top surface, and the leads extend beyond all four side surfaces.

12. The method of claim 11 wherein the leads are TAB leads.

13. The method of claim 12 wherein the leads are copper.

14. The method of claim 10, wherein
a support ring is secured to the leads between the first and second lead corners,
the bottom of the first punch contains a recess shaped to prevent the punch from contacting the support ring,
the abutment on the second punch contacts the leads between the support ring and the first lead corner, and
the abutment on the third punch contacts the leads between the support ring and the outer lead ends,
thereby forming the leads without contacting the support ring.

15. The method of claim 14 wherein the support ring is polyimide.

16. The method of claim 10 wherein prior to bending the leads, the first punch excises the leads at the outer lead ends from a TAB carrier film.

17. A method of forming a plurality of flexible TAB tape leads bonded to the top of an integrated circuit chip, wherein the chip contains a rectangular top surface and four adjacent side surfaces perpendicular to the top surface, and wherein the leads extend beyond all four side surfaces, are parallel to the top surface of the chip, and terminate at outer lead ends, and wherein a support ring is secured to the tops of the leads between the chip and outer lead ends, comprising:
aligning a first portion of the leads between the top of a lead form anvil and the bottom of a clamp, wherein the first portion begins at a first end adjacent to the chip outer periphery and ends at a second end between the chip outer periphery and the support ring,
actuating the clamp toward the anvil to releasably secure the second end of the first portion of the leads between the clamp and the anvil, wherein a first side of the clamp and a first side of the anvil form parallel surfaces perpendicular to the second ends of the first portion of the leads,
actuating a first punch toward the leads in sliding engagement with the first side of the clamp, wherein the bottom of the first punch contains a recess shaped to prevent the first punch from contacting the support ring, so that the first punch contacts the second end of the first portion of the leads and bends the leads at a first lead corner toward the first side of the anvil, thereby partially forming the leads,
retracting the first punch until the bottom of the first punch is co-planar with the bottom of the clamp,
actuating a second punch toward the leads in sliding engagement with the bottom of the first punch so that an abutment on the second punch contacts the leads at the first lead corners without contacting the support ring and releasably secures the first lead corners against the first side of the anvil,
actuating a third punch toward the leads in sliding engagement with the bottom of the second punch, after the second punch releasably secures the first lead corners, so that an abutment on the third punch contacts the leads between the support ring and the outer lead ends without contacting the support ring, and forces the leads toward the first side of the anvil, so that the bottom of the leads slide against a second anvil surface substantially perpendicular to and intersecting with the first anvil surface, and the top of the leads slide against the abutment on the third punch,
continuing to actuate the third punch so that a second corner of the leads is releasably secured between the abutment on the third punch and the intersection of the first and second anvil surfaces, without the third punch contacting the ring support, thereby forming a second portion of the leads with a first end at the first lead corner and a second end at the second lead corner, and a third portion of the leads with a first end at the second lead corner and a second end at the outer lead ends, and
retracting the clamp, second punch and third punch so that the leads are released,
wherein the first and second lead corners are perpendicular, the first and third portions of the leads are parallel to the top surface of the chip, the second portion of the leads is essentially perpendicular to the top surface of the chip, and the ring support remains undamaged and secured to the leads on the side opposite the chip.

18. The method of claim 17 wherein the TAB tape leads are copper.

19. The method of claim 17, further comprising, prior to forming the leads,
contacting the tops of the leads with the bottom of the first punch,
applying a pressure from the first punch to the outer lead ends as the outer lead ends contact an excise blade window,
excising the leads at the outer lead ends from a TAB tape carrier film at the excise blade window, and
actuating the first punch and excised leads through the excise blade window toward the form anvil.

20. An apparatus for forming a plurality of flexible metal leads connected to an integrated circuit chip which extend beyond the outer periphery of the chip and terminate at outer lead ends, comprising:
means for aligning a first portion of the leads between the top of a lead form anvil and the bottom of a clamp, wherein the first portion begins at a first end adjacent to the chip outer periphery and ends at a second end between the chip outer periphery and the outer lead ends,
means for actuating the clamp toward the anvil to releasably secure the second end of the first portion of the leads between the clamp and the anvil,
means for actuating a first punch toward the leads so that the first punch contacts the second ends of the first portion of the leads and bends the leads at a first lead corner toward the anvil,
means for actuating a second punch toward the leads so that an abutment on the second punch contacts the leads at or near the first lead corners and releasably secures the leads against the anvil, means for actuating a third punch toward the leads after the second punch releasably secures the leads so that an abutment on the third punch contacts the leads between the first lead corners and the outer lead ends and forces the leads toward the anvil, the bottom of the leads slide against the anvil, and the top of the leads slide against the abutment on the third punch, means for continuing to actuate the third punch so that a second corner of the leads is releasably secured between the abutment on the third punch and a corner of the anvil, thereby forming a second portion of the leads with a first end at the first lead corner and a second end at the second lead corner, and a third portion of the leads with a first end at the second lead corner and a second end at the outer lead ends, and means for retracting the clamp, first punch, second punch and third punch so that the leads are released, thereby slide forming the leads.

* * * * *

UNITED STATES PATENT AND TRADEMARK OFFICE
CERTIFICATE OF CORRECTION

PATENT NO. : 5,065,504

DATED : November 19, 1991

INVENTOR(S) : Michael A. Olla

It is certified that error appears in the above-identified patent and that said Letters Patent is hereby corrected as shown below:

On the Title page, item [57], col. 2,

Abstract, line 7, change "and" to -- the --.

Column 1, line 55, change "boding" to -- bonding --.

Column 2, line 6, insert -- . -- after "weight".

Column 3, line 20, change "elevation" to -- elevational --.

Column 3, line 59, insert -- frame -- after "TAB".

Column 4, line 41, insert -- is -- after "ring".

Column 5, line 38, delete -- a -- before "chip".

Column 9, line 21, insert -- first -- before "punch".

Signed and Sealed this

Ninth Day of November, 1993

*Attest:*

BRUCE LEHMAN

*Attesting Officer*  *Commissioner of Patents and Trademarks*